US008599035B2

(12) United States Patent
Crisp et al.

(10) Patent No.: US 8,599,035 B2
(45) Date of Patent: Dec. 3, 2013

(54) EQUIPMENT MODULE INDICATOR HANDLE AND METHODS FOR INDICATING EQUIPMENT MODULE STATUS

(75) Inventors: Richard A. Crisp, Austin, TX (US); David W. Williams, Salado, TX (US)

(73) Assignee: Dell Products L.P., Round Rock, TX (US)

( * ) Notice: Subject to any disclaimer, the term of this patent is extended or adjusted under 35 U.S.C. 154(b) by 304 days.

(21) Appl. No.: 13/016,250

(22) Filed: Jan. 28, 2011

(65) Prior Publication Data

US 2012/0194350 A1  Aug. 2, 2012

(51) Int. Cl.
| | |
|---|---|
| G08B 5/00 | (2006.01) |
| H02H 3/00 | (2006.01) |
| H05K 5/00 | (2006.01) |
| B25B 23/18 | (2006.01) |
| B60Q 1/26 | (2006.01) |

(52) U.S. Cl.
USPC ........ 340/815.42; 361/72; 361/754; 361/796; 362/119; 362/399; 362/501

(58) Field of Classification Search
USPC ............. 340/815.42, 815.43, 815.45, 815.49, 340/815.5, 815.53, 815.54, 815.55, 815.56, 340/815.57, 815.59, 815.65, 815.73, 340/815.89, 635; 362/119, 501, 399, 80; 361/754, 796, 755, 72; 710/301, 302
See application file for complete search history.

(56) References Cited

U.S. PATENT DOCUMENTS

| | | | |
|---|---|---|---|
| 4,840,583 A | 6/1989 | Moore | |
| 6,483,107 B1 | 11/2002 | Rabinovitz et al. | |
| 6,553,629 B2 * | 4/2003 | Grady et al. | 16/444 |
| 6,570,770 B1 * | 5/2003 | Ross et al. | 361/752 |
| 7,129,851 B1 * | 10/2006 | Garnett | 340/815.4 |
| 7,142,432 B2 | 11/2006 | Koerber et al. | |
| 7,374,319 B2 * | 5/2008 | Camarota et al. | 362/399 |
| 7,455,437 B2 | 11/2008 | Shi | |
| 7,494,365 B2 | 2/2009 | Gange | |
| 2006/0226953 A1 | 10/2006 | Shelley et al. | |
| 2009/0284358 A1 | 11/2009 | Ieda et al. | |
| 2009/0303699 A1 | 12/2009 | Van Gestel | |

FOREIGN PATENT DOCUMENTS

EP        1904273 B1    6/2006

OTHER PUBLICATIONS

GE Medical Systems (gemedical.com) GE Dash 3000_4000_5000 Patient Monitor Operator's Manual May 10, 2005 2023896-026A Revision A pp. 2-2 through 2-5 and others.*

* cited by examiner

*Primary Examiner* — Daniel Wu
*Assistant Examiner* — Mancil Littlejohn, Jr.
(74) *Attorney, Agent, or Firm* — Egan, Peterman & Enders LLP.

(57) ABSTRACT

Equipment module indicator handle apparatus and methods are provided for displaying indications of the status conditions of equipment module circuitry using a light-conductive handle body that includes at least one handle leg at least partially composed of light conductive material and configured to transmit emitted light from a proximate end of the indicator handle toward a distal end of the indicator handle to visibly display a status condition of the module circuitry to a user on a surface of the indicator handle that is spaced apart from the wall of a chassis of the module.

24 Claims, 10 Drawing Sheets

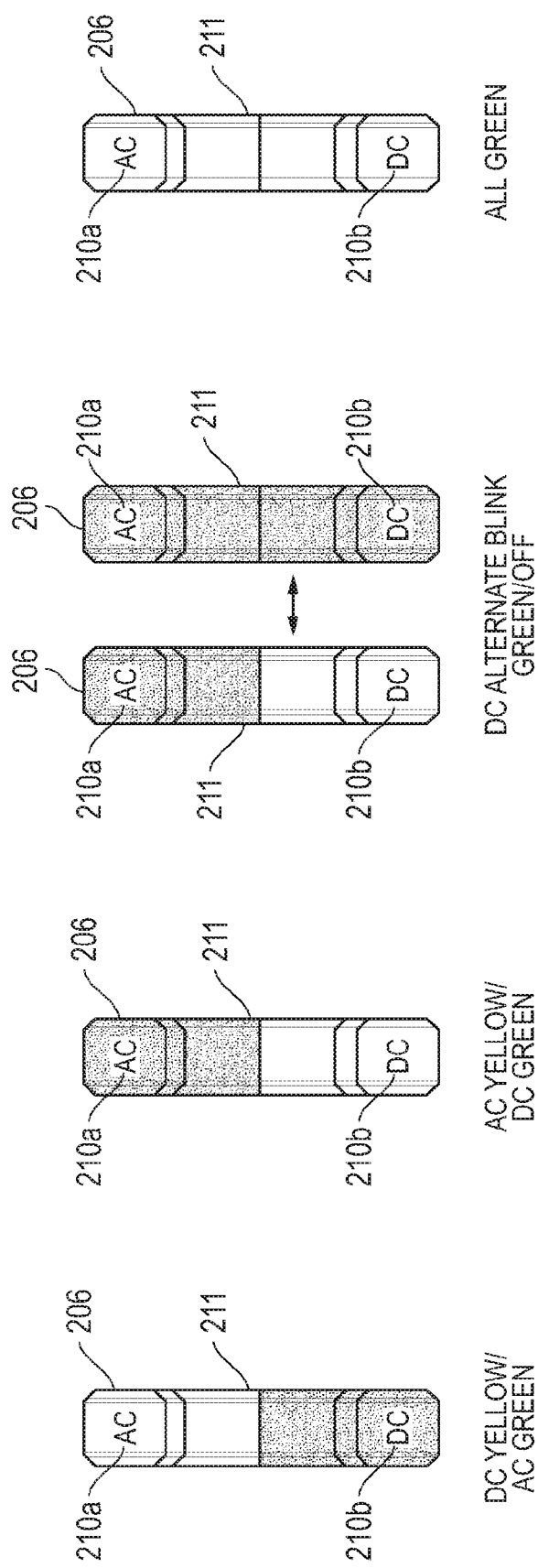

EQUIPMENT MODULE INDICATOR HANDLE AND METHODS FOR INDICATING EQUIPMENT MODULE STATUS

FIELD OF THE INVENTION

This invention relates generally to equipment modules and, more particularly, to apparatus and methods for indicating status of equipment modules.

BACKGROUND OF THE INVENTION

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems (such as servers) and other electronics may be configured as modular rack equipment for mounting on shelves of an equipment rack. Individual components of such rack equipment may include handles to facilitate installation and removal of the component from the rack. FIG. 1 illustrates an example of a conventional hot swap server power supply module 100, e.g., for insertion as one of two hot swappable power supply modules into the back side of a rack-mounted 11G server. As shown, power supply 100 includes a removable power supply chassis module 102 that contains electronic power supply circuitry that converts AC mains power provided at connector 108 to suitable DC power supplied to a server by power contacts 112. A spring-loaded module release lever 104 is provided for removably securing the power supply module chassis 102 in installed relationship with a server contained within a server rack. An opaque plastic handle 106 is provided to facilitate insertion and removal of chassis module 102 from the rear of the equipment rack. Also shown is LED 114 that is employed to indicate general health of the power supply, and the health of the power coming into and out of the unit, and power supply cooling fan 110 assembly.

SUMMARY OF THE INVENTION

Disclosed herein are equipment module indicator handle apparatus and methods for displaying indications of the status of equipment module, such as a power supply module for a rack mounted information handling system like a server. In one embodiment, the disclosed apparatus and methods may be implemented by providing a light-conductive (e.g., transparent) handle body for a replaceable equipment module (e.g., such as a rack equipment module) combined with one or more light-emitting elements (e.g., light emitting diodes LEDs, miniature incandescent bulbs, etc.) disposed in light transmitting relation to the handle body (e.g., at least partially embedded within the handle body) and configured to function together with the handle body as an indicator of one or more status conditions for the equipment module. Advantageously, the disclosed equipment module handle may be implemented in one embodiment with little or no added unit cost over conventional solutions to provide a user with a more visible status indication that is removed from the rear wall of a rack mounted equipment module, while at the same time providing increased surface area for status indication without interfering with cooling air flow or other features of the module by combining (e.g., by embedding) light emitting element/s with a handle of the equipment module.

In one embodiment, the embedded light-emitting element may be employed to emit one or more colors of light into the handle body in response to the existence and/or change of one or more status conditions (e.g., DC health such as DC power good and/or DC power fault, AC health such as AC power good and/or AC power fault, power supply mismatch, power supply fault, etc.), and the light-conductive handle body may be configured to internally transmit this emitted light to one or more external surfaces of the handle for visible display to a user. In one embodiment, two or more separate portions of an indicator handle may be each configured to display a different status condition. In this regard, each separate section of the handle may be configured as a respective separate light path (e.g., light pipe) for transmitting light from a different light-emitting element than from other light emitting elements of the handle apparatus.

Advantageously, in one exemplary embodiment the disclosed apparatus and methods may be implemented in a manner that allows equipment module status to be displayed with increased visibility to a user, e.g., by providing a visual status indication at the surface of a handle body that is raised or outwardly displaced at a distance relative to an outer wall of an equipment module such as a rack equipment module. For example, a status indication (e.g., such as a fault condition) may be provided on the back or rear side of a equipment module such that it is clearly visible and more useable in a fully deployed condition (e.g., substantially not obscured by power cables, line cords, or other types of cables or connection equipment which are often present on the rear side of an equipment rack or other type of equipment module system) to service personnel. When used to display a fault condition of a server power supply, the disclosed apparatus and methods facilitate a user's quick and accurate determination of which power supply of a given rack mounted server should be replaced, thus reducing the possibility that a properly operating power supply is inadvertently pulled for replacement which can potentially result in an undesired server shut down.

Furthermore, by integrating status display into a equipment module handle, the status display is not potentially obscured by the handle itself, as is often the case with conventional rack mounted equipment modules such as power supplies which employ a LED status indicator positioned beneath or behind the module handle. In this regard, the surface area of the rear wall of a conventional rack equipment power supply module is often limited due to the need for sharing space for power cord connector, cooling fan, status indicator and handle. The disclosed apparatus and methods may be thus implemented in one embodiment using a handle equipment indicator to display rack equipment status with increased visibility and without requiring additional chassis surface area. One or more icons may be optionally printed, molded, attached, or otherwise provided onto the handle surface itself such that no icons or associated artwork need be pad printed on the external surface of the chassis. This results in increased open area on the external chassis rear surface, thus improving thermal heat dissipation from the chassis during operation.

In another embodiment, a rack equipment indicator handle apparatus may be employed to display multiple status indicators to a user, in one example, without requiring additional equipment module chassis surface area as compared to a conventional equipment module. In one exemplary embodiment, a light-conductive rack equipment handle apparatus may be provided with at least two light-emitting elements embedded or otherwise disposed in light transmitting relation to the light-conductive material of the handle apparatus such that multiple types of status indication signals may be visibly displayed to a user at one or more external surfaces of a handle body of the handle apparatus. One or more additional light-emitting elements may be additionally provided on an outer chassis surface of the same equipment module (e.g., beneath the handle of the module).

In one respect, disclosed herein is an equipment module, including: an equipment module chassis containing module circuitry and having at least one wall with an outer surface; at least one first light-emitting element coupled to emit light to display a status condition of the module circuitry; an indicator handle configured for use by a user to withdraw and insert the module chassis from an equipment assembly, the indicator handle having a proximate end and a distal end disposed opposite to the proximate end, the indicator handle at least partially including light conductive material that is configured to transmit light from the proximate end toward the distal end of the handle. The indicator handle may further include at least one light conductive handle leg having a leg base mechanically coupled at the proximate end of the handle to the outer surface of the chassis wall and extending outward from the chassis wall to the distal end of the handle, the light conductive material of the handle leg being disposed to receive the emitted light from the first light-emitting element and transmit the emitted light toward the distal end of the indicator handle to visibly display a status condition of the module circuitry to a user on a surface of the indicator handle that is spaced apart from the wall of the module chassis.

In another respect, disclosed herein is an information handling system, including: an information handling system chassis, the information handling system chassis including a power supply receptacle defined therein and configured to receive a power supply module; a power supply module including a module chassis configured to be received in the power supply receptacle of the information handling system chassis, the power supply module chassis containing power conversion circuitry and having a rear wall with an outer surface. The power supply module may further include: at least one first light-emitting element coupled to emit light to display a status condition of the power conversion circuitry; an indicator handle configured for use by a user to withdraw and insert the module chassis from the power supply receptacle, the indicator handle having a proximate end and a distal end disposed opposite to the proximate end, the indicator handle at least partially including light conductive material that is configured to transmit light from the proximate end toward the distal end of the handle; and the indicator handle may further include at least one light conductive handle leg having a leg base mechanically coupled at the proximate end of the handle to the outer surface of the power supply module chassis rear wall and extending outward from the power supply module chassis rear wall to the distal end of the handle, the light conductive material of the handle leg being disposed to receive the emitted light from the first light-emitting element and transmit the emitted light toward the distal end of the indicator handle to visibly display a status condition of the module circuitry to a user on a surface of the indicator handle that is spaced apart from the rear wall of the power supply module chassis.

In another respect, disclosed herein is a method of displaying one or more status conditions of an equipment module to a user, the method including: providing an equipment module including a module chassis containing module circuitry and having at least one wall with an outer surface; providing an indicator handle configured for use by a user to withdraw and insert the module chassis from an equipment assembly, the indicator handle having a proximate end and a distal end disposed opposite to the proximate end, and having at least one light conductive handle leg having a leg base mechanically coupled at the proximate end of the handle to the outer surface of the chassis wall and extending outward from the chassis wall to the distal end of the handle; emitting at least one first light adjacent the proximate end of the indicator handle to display a status condition of the module circuitry; and transmitting the emitted first light from the proximate end of the indicator handle through the light conductive handle leg toward the distal end of the indicator handle to visibly display a status condition of the module circuitry to a user on a surface of the indicator handle that is spaced apart from the wall of the module chassis.

BRIEF DESCRIPTION OF THE DRAWINGS

FIG. 7 illustrates an end-on view of distal surface of an indicator handle according to one exemplary embodiment of the disclosed apparatus and methods.

FIG. 8 illustrates an end-on view of distal surface of an indicator handle according to one exemplary embodiment of the disclosed apparatus and methods.

FIG. 9 illustrates an end-on view of distal surface of an indicator handle according to one exemplary embodiment of the disclosed apparatus and methods.

FIG. 10 illustrates an end-on view of distal surface of an indicator handle according to one exemplary embodiment of the disclosed apparatus and methods.

DESCRIPTION OF ILLUSTRATIVE EMBODIMENTS

Figure 1:
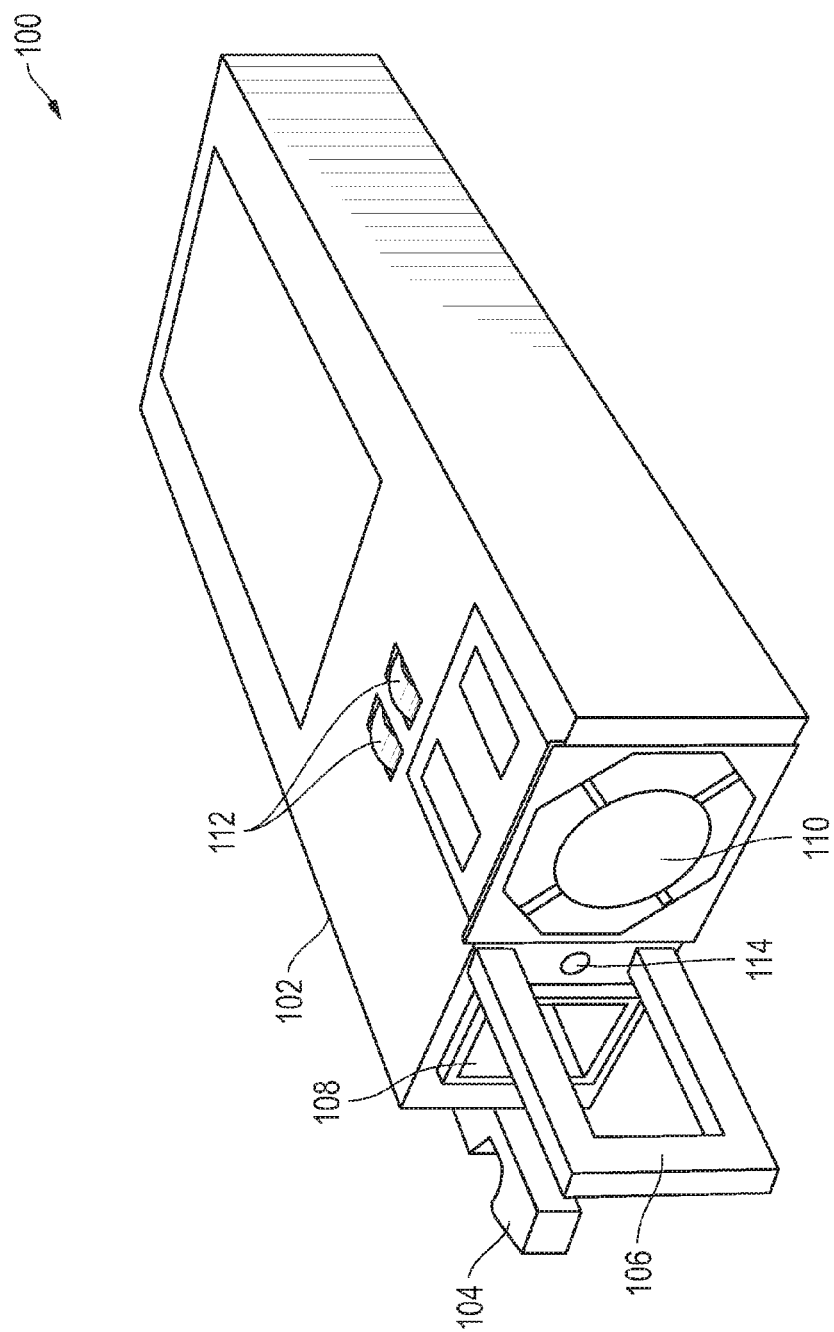
FIG. 1 illustrates a perspective view of a conventional power supply.
Figure 2A:
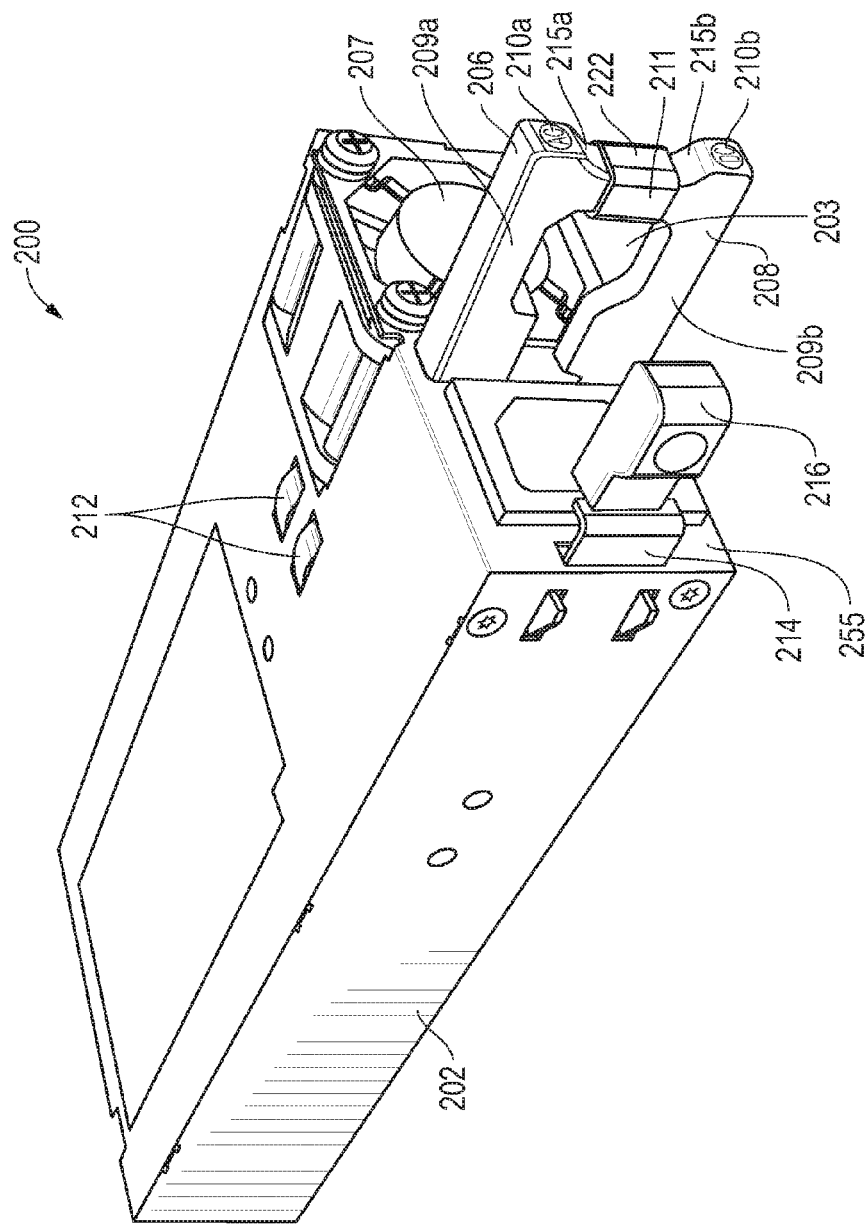
FIG. 2A illustrates a perspective view of a power supply module according to one exemplary embodiment of the disclosed apparatus and methods.
Figure 2B:
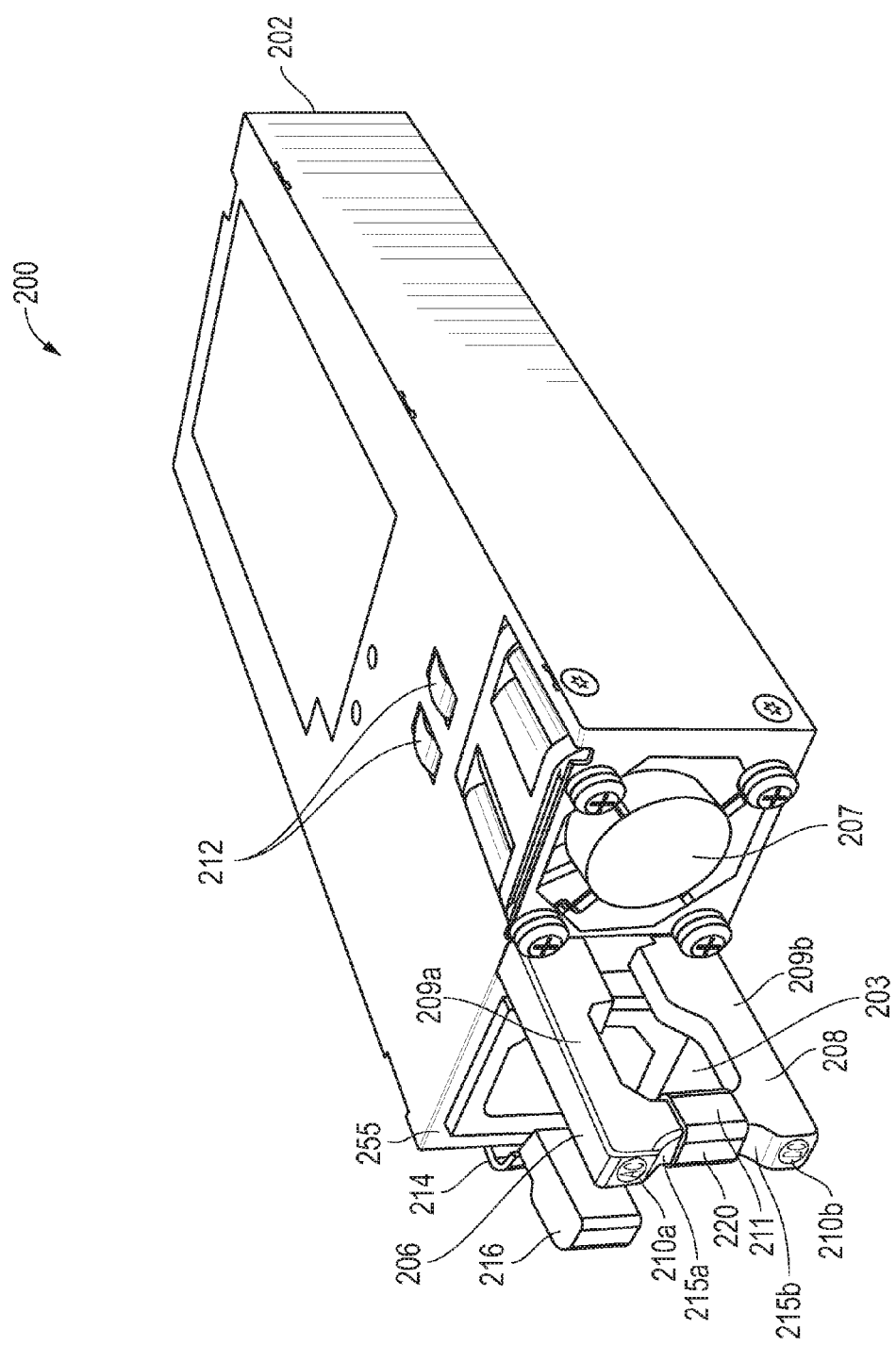
FIG. 2B illustrates a perspective view of a power supply module according to one exemplary embodiment of the disclosed apparatus and methods.

FIGS. 2A and 2B are different views illustrating an exemplary embodiment of a rack mounted equipment module provided in the form of a power supply module 200 for a rack mounted information handling system, such as a server. In this exemplary embodiment, power supply module 200 is configured as a hot-swappable power supply that may be slidably received into a complementary dimensioned power supply receptacle in a rack mounted server chassis. Although a hot-swappable power supply module 200 for a rack mounted information handling system is illustrated, it will be understood that the disclosed equipment module indicator handle apparatus and methods may be implemented with other types of equipment modules including, but not limited to, equipment modules including circuitry other than power supply circuitry (e.g., media drive modules, processing modules, etc.). Moreover, the disclosed equipment module indicator handle apparatus and methods may be implemented in other types of module environments, e.g., to provide indicator handle apparatus for indicating status of circuitry of equipment modules that are slidably received in equipment assemblies such as a tower computer chassis, a deskside computer chassis, etc. Types of information handling systems that may employ equipment modules configured with the disclosed indicator handle apparatus include, but are not limited to, server systems, blade systems, storage systems, etc.

As shown in FIGS. 2A-2B, power supply module 200 includes a chassis 202 within which are disposed power supply components such as voltage converter and related circuitry for conditioning power for the server electronics. A retention mechanism in the form of release lever 216 is provided as shown on one side of power supply chassis 202 for latchably retaining power supply module 200 in engaged position within the receptacle of the server. A power connector 214 is provided as shown in the rear surface 255 of chassis 202 for interconnection with an AC mains power cable for providing power to module 200, and power contacts 212 are shown provided on an upper surface of chassis 202 for purpose of supplying conditioned power to electronics of a server via complementary mating contacts within the server power supply receptacle. Mechanical interference between release lever 216 and an AC power plug connected to power connector 214 servers to prevent release lever 216 from being activated to remove module 200 from a server receptacle when AC power plug is plugged in to connector 214 of module 200.

Also shown in FIGS. 2A-2B are cooling fan exhaust 207 and optional surface-indicating LED status indicator 208 that are provided on the rear surface 255 of power supply chassis 202, with the presence of indicator 208 providing for a total of three light-emitting elements in this embodiment for displaying power supply status conditions. A light-conductive indicator handle 206 is coupled to rear surface 255 of chassis 202 between power connector 214 and cooling fan intake 207 as shown. It will be understood that the illustrated positioning of handle 206 on rear chassis surface 255 is exemplary only, and that a handle 206 may be provided in any other position on the rear surface of a power supply chassis that is suitable for providing a hand grip for a user to withdraw and/or insert a power supply module 200 into a server power supply receptacle, e.g., such as during a power supply hot-swap operation. It will also be understood that the presence and/or particular positioning of cooling fan 207, surface-indicating LED indicator 208 and/or power connector 214 are optional as well. Moreover, it will be understood that a handle 206 may be provided on any other surface (e.g., front surface) of a rack mounted equipment chassis (or tower server, etc.) that is suitable for providing a hand grip for a user to withdraw and/or insert the module from the equipment assembly.

Still referring to FIGS. 2A-2B, indicator handle 206 includes two handle legs 209a and 209b joined at a distal end of the handle 206 by a grip section in the form of cross member segment 211 defining a handle aperture 203 therebetween. Handle aperture 203 is present to provide a hand grip to allow a user to insert and/or withdraw power supply module 200 from a server power supply receptacle. Indicator handle may be manufactured using any suitable technique (e.g., molding) and from any light conductive material that is suitably strong enough to facilitate a user's hand in to perform power supply insertion and removal tasks. Examples of suitable light-conductive materials include, but are not limited to, light-conductive plastics (such as polished polycarbonate, textured polycarbonate, tinted polycarbonate, Acrylic, PMMA, etc.) and other materials such as glass, etc. The light-conductive material may be transparent or only partially transparent as long as at least a portion of at least one leg 209 of handle 206 is capable of transmitting light from the base or proximate end of a given handle leg 209 to an outer side and/or distal surface of the handle for visible display to a user in a manner as described further herein.

In the illustrated embodiment of FIGS. 2A-2B, each of handle legs 209a and 209b form separate sections or segments of handle 206 that each terminate in a respective distal surface 210a or 210b on which a respective status icon may be optionally disposed and/or formed (e.g., by molding) as shown. For example, in the illustrated embodiment, handle leg 209a terminates in distal surface 210a upon which an icon labeled "AC" is disposed and handle leg 209b terminates in distal surface 210b upon which an icon labeled "DC" is disposed. The change in color state of the LED light represents the status of the "AC" and "DC" indicators communicate the health/or status of the unit. As will be described further herein, distal surface 210a may be selectively and independently lit by a first light-emitting element to indicate a status of a first condition, and distal surface 210b may be selectively and independently lit by a second light-emitting element to indicate a status of a different and separate condition. Moreover, a given single handle leg 209 may be configured to indicate more than one status condition by employing multiple light colors, light intensity, and/or blinking or flashing to represent different status conditions. In one embodiment, a respective light-emitting element may be selectively lit so that light is transmitted by the light-conductive material of the respective handle leg 209 to one or more external surfaces (external distal surface and/or external side surface/s) of the leg 209 or handle cross member 211 upon occurrence of a corresponding designated status. In the embodiment of FIG. 2A, an optional Velcro retention strap 220 is shown wrapped around a narrowed portion cross member 211 on the distal end of indicator handle 206 that may be used for purposes of securing and retaining an AC power cable to power connector 214 to prevent accidental unplugging when an AC power cable is present to supply power to power supply module 200. It will be understood that a cross member section 211 need not be narrowed as shown in this embodiment, but may have any other suitable cross section.

Figure 3:
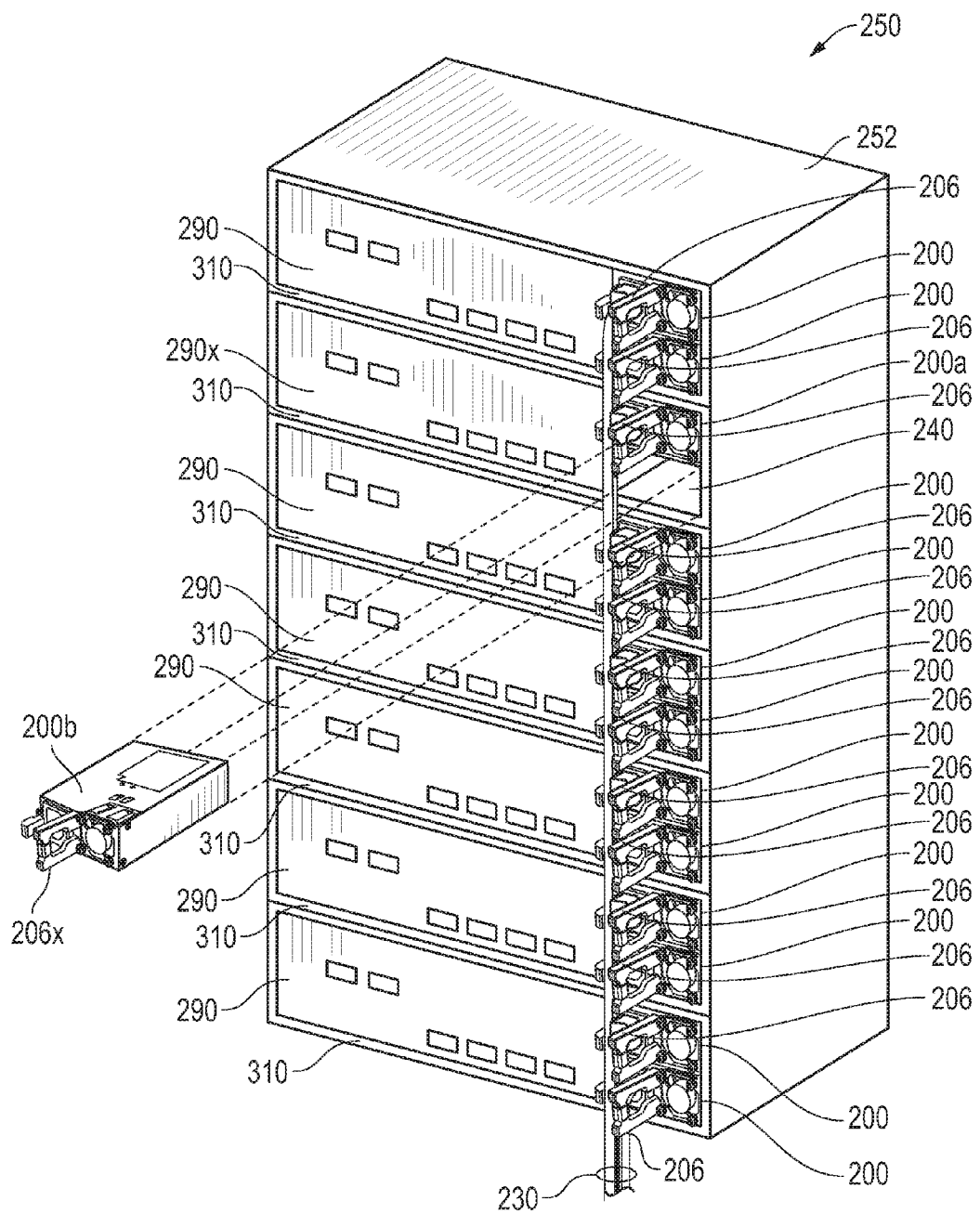
FIG. 3 illustrates a perspective view of a rack mounted equipment system according to one exemplary embodiment of the disclosed apparatus and methods.
Figure 4:
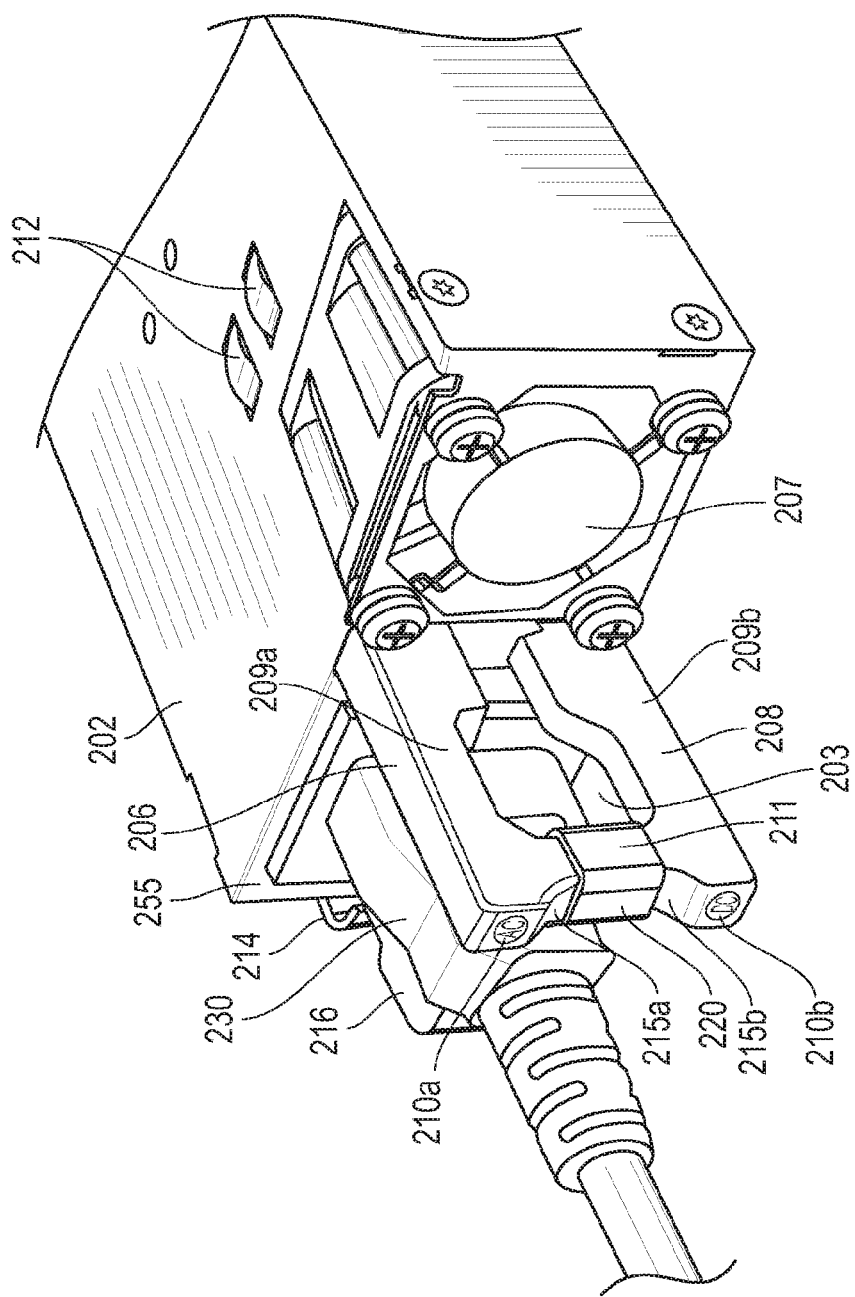
FIG. 4 illustrates a perspective view of a power supply module according to one exemplary embodiment of the disclosed apparatus and methods.
Figure 5:
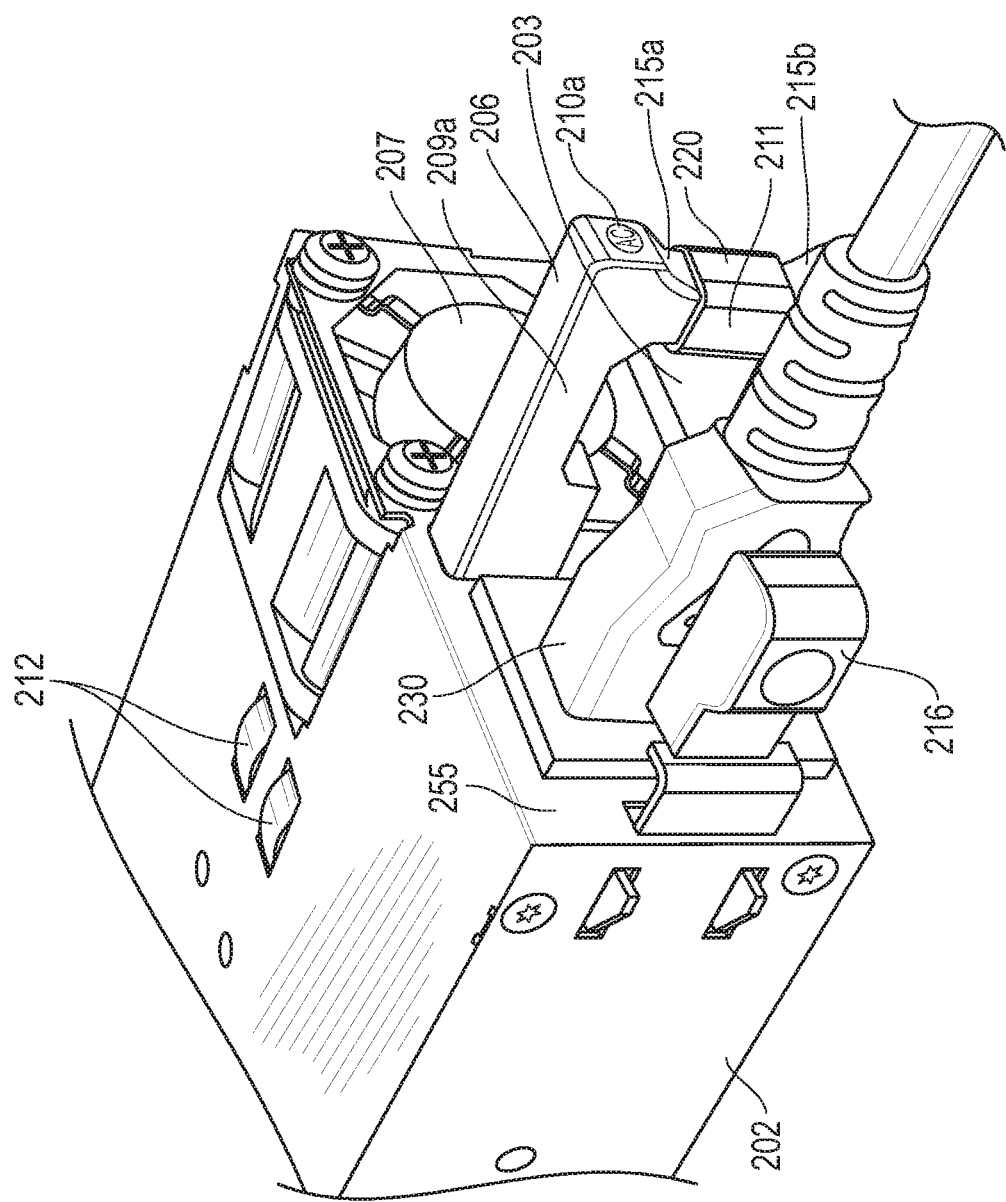
FIG. 5 illustrates a perspective view of a power supply module according to one exemplary embodiment of the disclosed apparatus and methods.

FIG. 3 illustrates one exemplary embodiment of a rack mounted equipment system 250 that includes an equipment rack 250 having multiple shelves 310, upon each of which is disposed an information handling system in the form of an individual information handling system chassis configured in this embodiment as a server chassis 290 including a server load (e.g., one or more disk drive/s, one or more processors and/or CPUs, cooling fan, memory, etc.). As shown, each server chassis 290 includes two power supply modules 200 such as described in relation to FIG. 3, in order to provide a hot-swap capability. This is illustrated by one power supply module 200b which is poised for insertion by handle 206x into power supply receptacle 240 of server chassis 290x at the same time that power supply 200a continues to supply power to a server load of server 290x so as to provide the capability of replacing a defective power supply 290 without shutting down server load of server chassis 290x. As described elsewhere herein, the failure of a given power supply module 200 may be indicated to a user by selectively lighting or not lighting the respective indicator handle 206 of the defective module 200 so that the user may readily identify and replace the particular power supply module 200 that is defective. By virtue of the fact that each indicator handle 206 projects outwardly from the rear surface 255 of its respective power supply module 200, the failure indication may be displayed on an indicator handle surface that in one exemplary embodiment extends beyond hanging power cables 230 and other hanging connector cables (e.g., Ethernet data cables, fiber optic data cables, etc.) that may be connected to the rear surfaces 255 of power supply modules 200 of equipment rack 250. However, it will be understood that it is not necessary that the indicator handle surface extend beyond hanging power and/or connector cables in order to provide improved visibility to a user of displayed status condition/s of the module circuitry. FIGS. 4-5 illustrate different views of a power supply module 200 with a power cable 230 coupled to module power connector 214 to supply AC mains power to the module.

Figure 6:
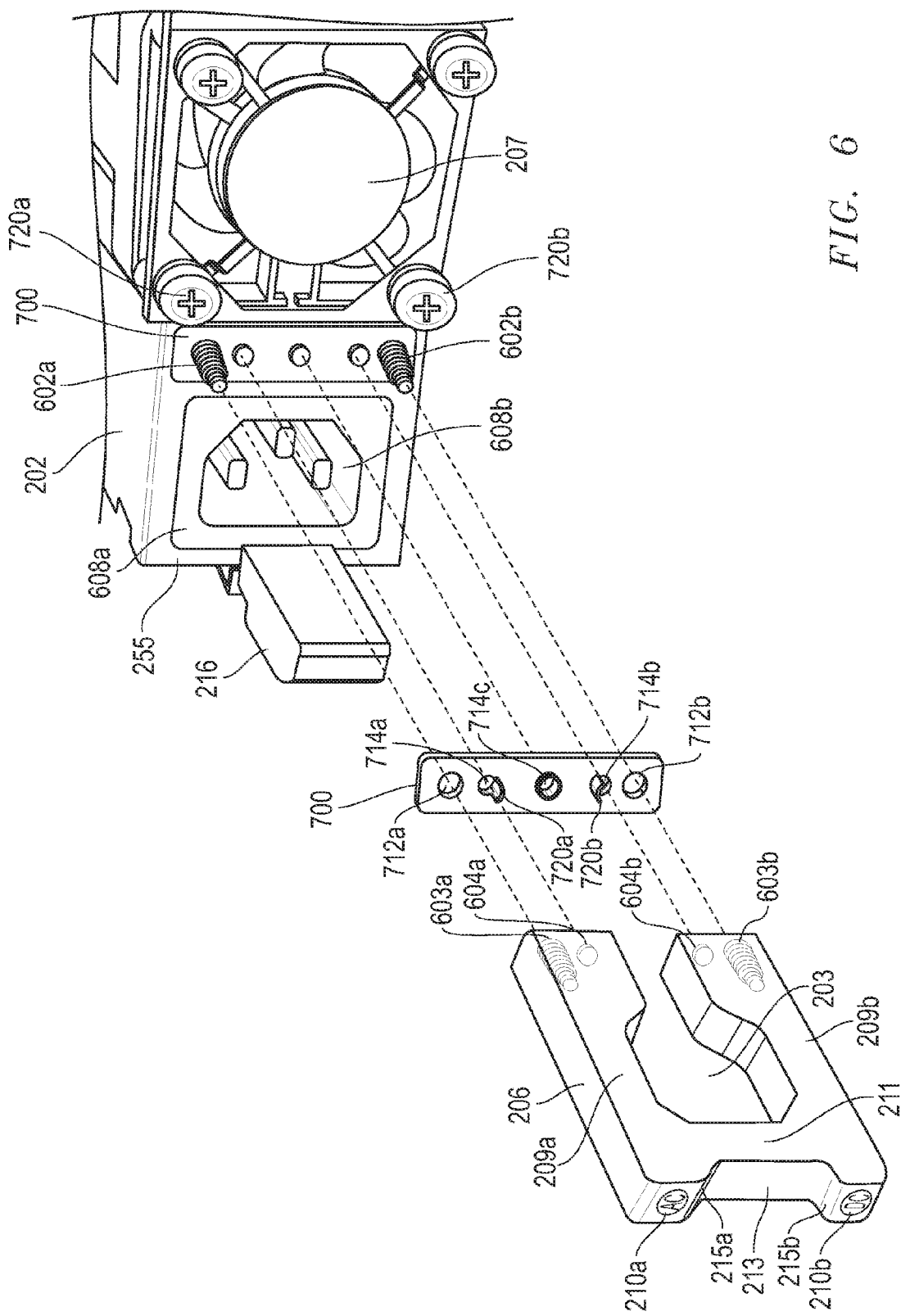
FIG. 6 illustrates an exploded perspective view of a power supply module according to one exemplary embodiment of the disclosed apparatus and methods.

FIG. 6 is an exploded view showing interrelation of handle indicator 206, optional light emitting element carrier plate 700 and power supply module chassis 202 of a power supply module 200 that may be employed according to one exemplary embodiment of the disclosed apparatus and methods. It will be understood that this embodiment is exemplary, and that other configurations may be employed, e.g., each light-emitting element (e.g., LED) may be provided with its own standard grommet type holder without the presence of optional carrier plate 700. As shown in FIG. 6, two externally threaded handle connector studs 602a and 602b may be provided that project from rear surface 255 of module chassis 202 for securably attaching each of handle legs 209a and 209b of indicator handle 206 to rear surface 255 of power supply module chassis 202. In this regard, two complementary internally securing apertures 603a and 603b may be defined in the proximate end of respective legs 209a and 209b of for mating with and securably receiving threaded studs 602a and 602b. Alternatively, handle connector studs may be non-threaded and secured within non-threaded handle leg apertures using any other suitable securing method, e.g., press fitting, adhesive, etc. It will be understood that any other configuration may be employed for securing an indicator handle to the rear surface 255 of a power supply module chassis 202, e.g., flush attachment by adhesive, studs projecting from each of legs 209a and 209b into mating and complementary receptacles defined in rear surface 255 of module chassis 202, etc.

In the exemplary embodiment of FIG. 6, light emitting elements 608a and 608b in the form of light emitting diodes (LEDs) may be provided as shown for indicating status of at least two different respective status conditions (e.g., internal DC health such as DC power good and/or DC power fault, external AC health such as AC power good and/or AC power fault, power supply mismatch, general power supply failure, etc.), it being understood that single color LEDs, bi-color LEDs, tri-color LEDs and/or other types of light-emitting elements may be employed, for example, to denote hot-swap status, etc. When present, a surface-indicating status indicator 208 may be employed to indicate additional or other power supply module status conditions (e.g., such as sleep state, active state, redundant state, non-redundant state, etc.), it being understood that any given light emitting element 608 or 208 may be configured to indicate any given status condition or combination of status conditions.

Light emitting elements 608a and 608b may be mounted within or on rear surface 255 of power supply module chassis 202 and, in one embodiment, light emitting elements may be mounted to rear surface 255 of chassis 202 using an optional element carrier plate 700 that may be disposed between indicator handle 206 and rear surface 255 of chassis 202. In one embodiment, carrier 700 may be a relatively thin plastic or rubberized component having apertures 712 and 714 defined to extend through carrier 700 as shown. As shown for the embodiment of FIG. 6, apertures 712a and 712b are dimensioned and positioned to receive respective handle connector studs 602a and 602b, and apertures 714a and 714b are dimensioned and positioned to receive respective light emitting elements 608a and 608b. In those applications where surface status indicator 208 is employed, an additional aperture 714c may be positioned and defined in carrier 700 for receiving same. As further shown, optional light shields 720a and 720b may be provided as shown adjacent an interior side of each of apertures 714a and 714b (i.e., the side of each aperture facing the midpoint between the apertures 714a and 714b) for purposes of directing light to proper surfaces and preventing light from light emitting element 208 from bleeding into portions of indicator handle 206. Optional light shields 720a and 720b may be present with or without optional carrier plate 700.

Still referring to FIG. 6, optional light recesses 604a and 604b may be optionally defined in the proximate end of each of respective legs 209a and 209b for receiving protruding dimensions of each of respective LEDs 608a and 608b, it being understood that any other alternative configuration may be employed that is suitable for interfacing light-emitting elements with leg bases 209a and 209b such that light is transmitted from each of the light-emitting elements into at least a portion of the light-conductive material of indicator handle 206. For example, light emitting elements may be mounted or recessed within rear surface 255 of chassis 202 with no light recesses 604 provided in proximate end of indicator handle 206. Alternatively, light emitting elements may be directly mounted within the base legs of an indicator handle, with electrical connectors provided for receiving indicator power signals from mating connectors provided in rear surface 255 of power supply module chassis 202 so as to selectively cause either or both of light-emitting elements 608a and 608b to emit light.

FIG. 6 also illustrates how cross member 211 of indicator handle 206 may optionally be narrowed with provided sloped step-down surfaces 215a and 215b to help separate and prevent light emitted from each of light-emitting elements 608a and 608b from bleeding over to the other side of indicator handle 206. In the exemplary embodiment of FIG. 6, a flattened surface 213 is shown defined between sloped step-down surfaces 215a and 215b. Optional Velcro retention strap 220 is not present in the embodiment of FIG. 6.

FIGS. 7-10 illustrate examples of how different power supply status conditions may be indicated to a server user by using separate light paths to light portions of the distal surface of handle indicator 206 of the exemplary embodiment of FIGS. 2-6. Specifically, FIG. 7 shows an end-on view of distal surface of cross member segment 211 of indicator handle 206 lighted to show power supply status AC good and DC fault condition, with AC light path displaying green light and DC light path displaying yellow light. FIG. 8 shows an end-on view of distal surface of cross member segment 211 of indicator handle 206 lighted to show a power supply status DC good and AC fault condition, with DC light path displaying green light and AC light path displaying yellow light. FIG. 9 shows an end-on view of distal surface of cross member segment 211 of indicator handle 206 lighted to show a status of power supply unit (PSU) mismatch, with DC light path alternately blinking between off and green light and AC light path remaining lit with green light. FIG. 10 shows an end-on view of distal surface of cross member segment 211 of indicator handle 206 lighted to show a power supply status DC good and AC good condition, with both DC light path and AC light path displaying green light. It will be understood that the embodiments of FIGS. 7-10 are exemplary only, and that many other configurations are possible.

Figure 11:
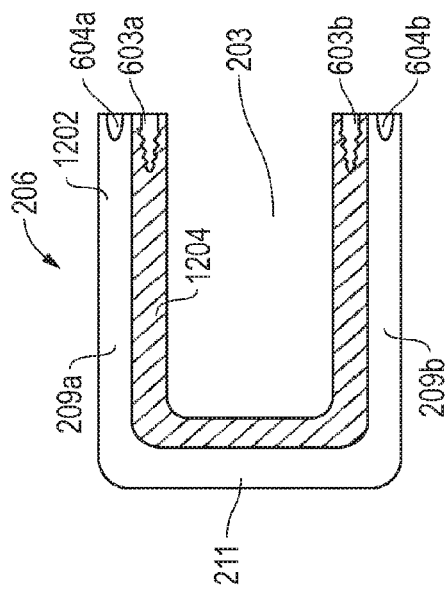
FIG. 11 illustrates a side view of an indicator handle according to one exemplary embodiment of the disclosed apparatus and methods.
Figure 12:
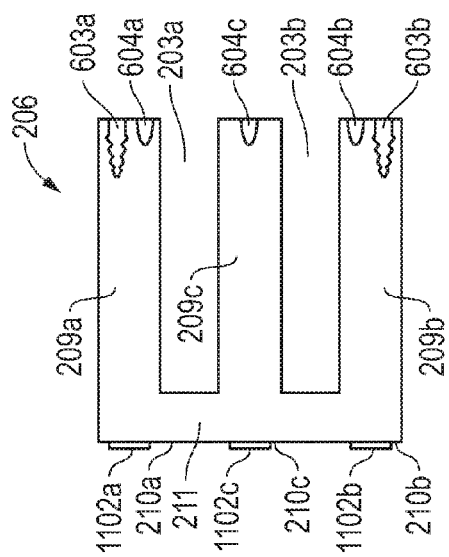
FIG. 12 illustrates a side view of an indicator handle according to one exemplary embodiment of the disclosed apparatus and methods.

FIGS. 11-13 illustrate exemplary embodiments of handle indicator 206. In these illustrated embodiments, optional step-down surfaces 215a and 215b are not present although they may be provided for any of these embodiments if so desired. FIG. 11 illustrates an indicator handle having two outer handle legs 209a and 209b and a center handle leg 209c, all joined at a distal end of the handle 206 by a cross member section or segment 211 to define two handle apertures 203a and 203b therebetween. Indicator handle 206 may be a single piece of light-conductive material (e.g., polycarbonate) such as described elsewhere herein. In the embodiment of FIG. 11, each leg 209 may be provided with a respective light recess 604 for receiving a separate and different light-emitting element 608 such that upon an occurrence of a given status condition each given leg 209a, 209b and 209c transmits light from the base or proximate end of the given handle leg 209 to the distal end of handle 206 for visible display to a user indicating occurrence of that given status condition. As shown, three different status icons 1102a, 1102b and 1102c may be optionally provided on respective distal ends 210a, 210b and 210c of handle legs 209a, 209b and 209c.

FIG. 12 illustrates an exemplary embodiment of a two-material handle indicator 206 in which an outer peripheral rim 1202 of light-conductive material (e.g., polycarbonate) is joined to an inner rim 1204 of non-light conductive material (e.g., non-light-conductive plastic). Outer rim 1202 may be, for example, a separate component that is snap-fitted to inner rim 1204, or outer rim 1202 may be co-molded with inner rim 1204. In this embodiment, securing apertures 603a and 603b are defined in the non-light conductive inner rim 1204, and light recesses 604a and 604b are defined in the outer peripheral rim 1202.

Figure 13B:
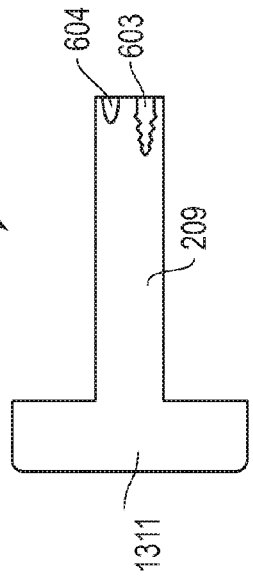
FIG. 13B illustrates a side view of an indicator handle according to one exemplary embodiment of the disclosed apparatus and methods.
Figure 13A:
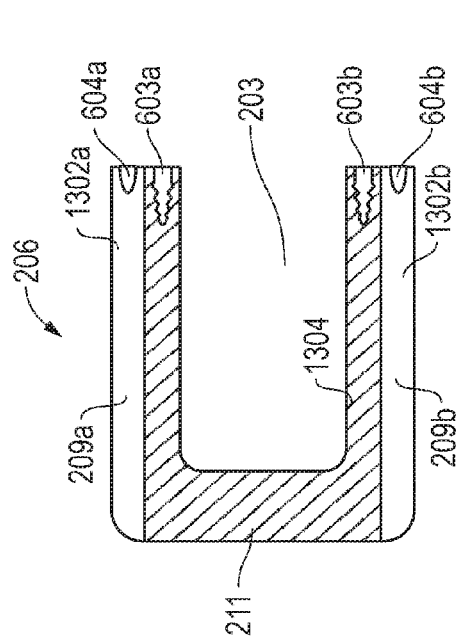
FIG. 13A illustrates a side view of an indicator handle according to one exemplary embodiment of the disclosed apparatus and methods.

FIG. 13A illustrates an exemplary embodiment of a two-material handle indicator 206 in which two outer side pieces 1302 of light-conductive material (e.g., polycarbonate) are joined to a center piece 1304 of non-light conductive material (e.g., non-light-conductive plastic). Outer side pieces 1302 may be, for example, separate components that are snap-fitted to center piece 1304, or outer side piece 1302 may be co-molded with inner piece 1304. In this embodiment, securing apertures 603a and 603b are defined in non-light conductive center piece 1304, and light recesses 604a and 604b are defined in outer side pieces 1302a and 1302b, respectively. Thus, in FIG. 13 the respective light paths of each of side pieces 1302a and 1302b are completely separated.

FIG. 13B illustrates an exemplary embodiment of a single leg indicator handle 1306 that may be a single piece of light-conductive material (e.g., polycarbonate) or may be of multi-material construction such as described elsewhere herein. Single leg indicator handle 1306 includes a single handle leg 209 with a "T-shaped" member segment 1311 provided on a distal end of handle 1306 to provide a grip section for a user's hand to withdraw or insert a rack-mounted equipment module. In this exemplary embodiment, a securing apertures 603 and a light recess 604 are each defined in leg 209 at a proximate end of handle 1306. As with other embodiments, leg 209 is configured to act as a light path (e.g., light pipe) for transmitting light produced by a light emitting element received in recess 604.

Figure 14:
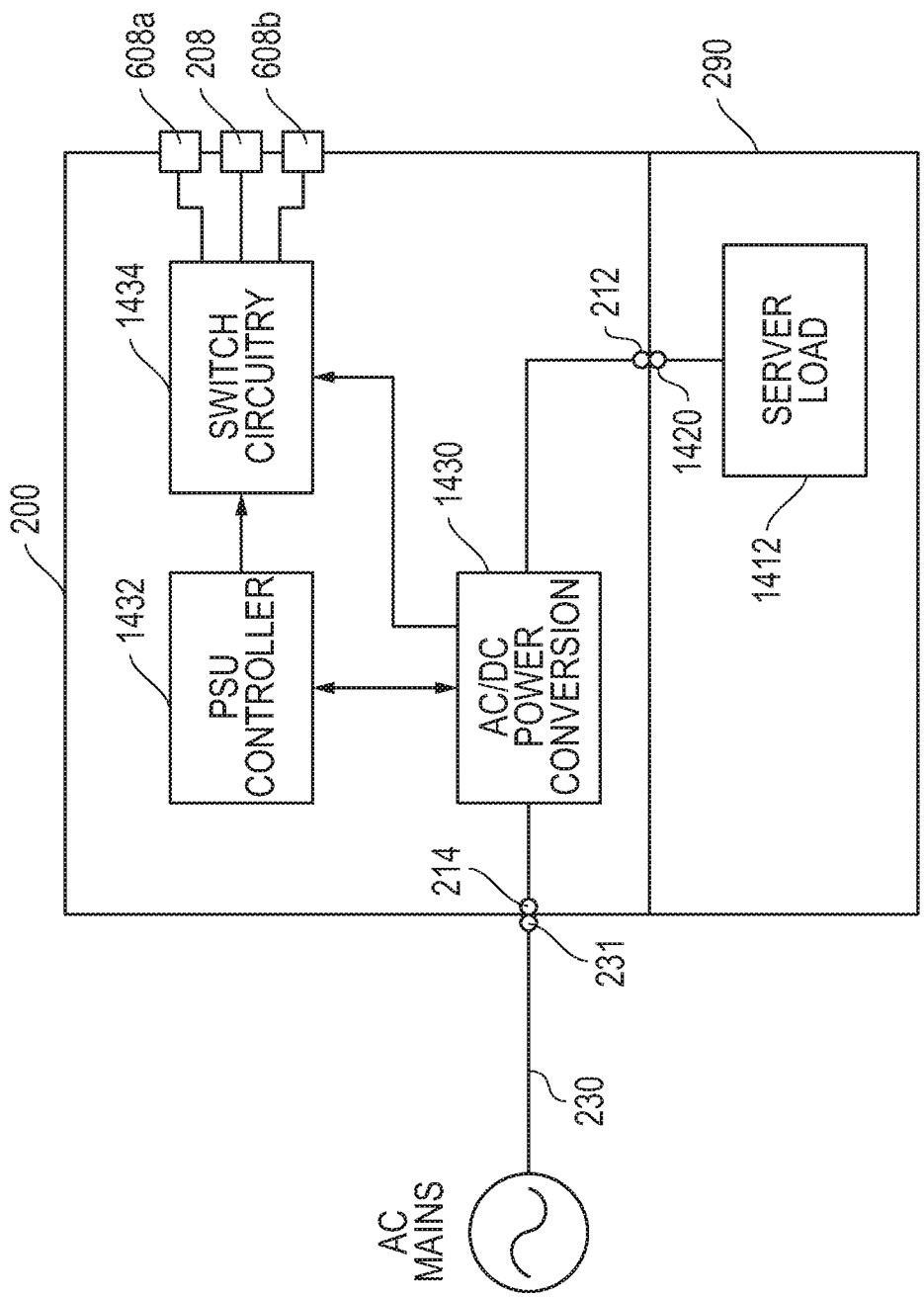
FIG. 14 is a block diagram of a rack mounted power supply module and an information handling system according to one exemplary embodiment of the disclosed apparatus and methods.

FIG. 14 illustrates a block diagram of an exemplary embodiment of a rack mounted power supply module 200 disposed in operative relationship with an information handling system 1410 configured in the form of a rack-mounted server (e.g., with module 200 disposed within a server power supply receptacle of system 1410). As shown in FIG. 14, AC power is provided from AC mains to AC/DC power conversion circuitry 1430 of power supply module 200 via power cable 230 and AC power plug 231 that is coupled to module power connector 214. AC/DC power conversion circuitry 1430 in turn provides DC power to server load 1412 (e.g., disk drive/s, one or more processors and/or CPUs, cooling fan, memory, etc.) of server 1410 via power contacts 212 and mating contacts 1420 of the server 1410. A power supply controller 1432 (e.g., CPU, microcontroller, or other suitable processing device) is provided within power supply module 200 for monitoring and controlling operation of AC/DC power conversion circuitry 1430. Among its capabilities, power supply controller 1432 may monitor status conditions of AC/DC power conversion circuitry 1430 (e.g., presence of connected AC power supply, presence of connected server load, operating health of AC and DC circuitry portions) and control switch circuitry 1434 (e.g., transistor switching circuitry such as MOSFET or bi-polar switches) to selectively light one or more of light-emitting elements 608a, 608b and/or 208 based on detected status conditions of AC/DC power conversion circuitry 1430 in a manner as described elsewhere herein.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed apparatus and methods may be utilized in various combinations and/or independently. Thus the invention is not limited to only those combinations shown herein, but rather may include other combinations.

What is claimed is:

1. An equipment module, comprising: an equipment module chassis containing module circuitry and having at least one wall with an outer surface;
at least one first light-emitting element coupled to emit light to display a status condition of the module circuitry;
an indicator handle configured for use by a user to withdraw and insert the module chassis from an equipment assembly,
the indicator handle having a proximate end and a distal end disposed opposite to the proximate end, the indicator handle at least partially comprising light conductive material that is configured to transmit light from the proximate end toward the distal end of the handle; and
the indicator handle further comprising at least one light conductive handle leg having a leg base mechanically coupled at the proximate end of the handle to the outer surface of the chassis wall and extending outward from the chassis wall to the distal end of the handle, the light conductive material of the handle leg being disposed to receive the emitted light from the first light-emitting element and transmit the emitted light toward the distal end of the indicator handle to visibly display a status condition of the module circuitry to a user on a surface of the indicator handle that is spaced apart from the wall of the module chassis;
wherein the at least one light conductive handle leg forms a separate segment of the indicator handle terminating at the distal end of the handle; and where the light conductive material of the handle leg is disposed to receive the emitted light from the first light-emitting element and transmit the emitted light toward the terminal distal end of the indicator handle to visibly display a status condition of the module circuitry to a user on the distal surface of the indicator handle that is spaced apart from the wall of the module chassis.

2. An equipment module, comprising an equipment module chassis containing module circuitry and having at least one wall with an outer surface;
at least one first light-emitting element coupled to emit light to display a status condition of the module circuitry;
an indicator handle configured for use by a user to withdraw and insert the module chassis from an equipment assembly, the indicator handle having a proximate end and a distal end disposed opposite to the proximate end, the indicator handle at least partially comprising light conductive material that is configured to transmit light from the proximate end toward the distal end of the handle; and
the indicator handle further comprising at least one light conductive handle leg having a leg base mechanically coupled at the proximate end of the handle to the outer surface of the chassis wall and extending outward from the chassis wall to the distal end of the handle, the light conductive material of the handle leg being disposed to receive the emitted light from the first light-emitting element and transmit the emitted light toward the distal end of the indicator handle to visibly display a status condition of the module circuitry to a user on a surface of the indicator handle that is spaced apart from the wall of the module chassis; and
the equipment module further comprising a status icon provided on the spaced apart surface of the indicator handle that is spaced apart from the wall of the module chassis upon which the status condition of the module circuitry is displayed to a user.

3. The module of claim 1, the indicator handle comprising multiple light conductive handle legs that each have a respective leg base mechanically coupled at the proximate end of the handle to the outer surface of the chassis wall and extending outward from the chassis wall to the distal end of the handle, the light conductive material of each handle leg being disposed to receive the emitted light from a respective different first light-emitting element than each other of the handle legs and to transmit the emitted light toward the distal end of the indicator handle by a separate light path than each other of the handle legs to visibly display a status condition of the module circuitry to a user on a surface of the indicator handle that is spaced apart from the wall of the module chassis.

4. The module of claim 1, the indicator handle comprising at least two adjacent light conductive handle legs that each have a respective leg base mechanically coupled at the proximate end of the handle to the outer surface of the chassis wall and extending outward from the chassis wall to the distal end of the handle, the light conductive material of each handle leg being disposed to receive the emitted light from a respective different first light-emitting element than the other of the handle legs and to transmit the emitted light toward the distal end of the indicator handle by a separate light path than the other of the handle legs to visibly display a status condition of the module circuitry to a user on a surface of the indicator handle that is spaced apart from the wall of the module chassis.

5. The module of claim 4, further comprising at least one surface indicating second light-emitting element mechanically coupled to the wall of the module chassis and disposed in a position between the two light conductive handle legs, the surface indicating light emitting element being configured to emit light to display a different status condition of the module circuitry than the status conditions displayed by the first light emitting elements.

6. The module of claim 5, further comprising light shields positioned adjacent an interior side of each of the two first light-emitting elements in a position between each first light-emitting element and the surface indicating second light-emitting element.

7. The module of claim 4, each of the two handle legs comprising:
light conductive material forming a light path extending from the proximate end toward the distal end of the handle; and non light conductive material coupled to the light conductive material of each handle leg in a position between each light pipe and the other handle leg.

8. The module of claim 1, the light conductive material of the leg base having a light recess defined therein to physically receive the first light-emitting element therein and a securing aperture defined therein and configured to securably receive a connector stud; the light emitting element extending from the wall of the module chassis and being received in the light recess of the leg base; and the equipment module further comprising a connector stud extending from the wall of the module chassis, the connector stud being securably received within the securing aperture of the indicator handle to mechanically couple the leg base to the chassis module wall.

9. The module of claim 1, the module comprising a rack mounted power supply module and the circuitry comprising hot-swappable power supply circuitry; the at least one chassis wall with an outer surface being the rear wall of the power supply module; the outer dimensions of the module chassis being configured to be mechanically received within a complementary dimensioned power supply receptacle of a rack mounted server; and the displayed status condition comprising at least one of power supply AC health, power supply DC health, power supply mismatch, or a combination thereof.

10. The module of claim 9, wherein the power supply module is configured such that during operation of the power supply module the indicator handle extends outward from the rear wall of the power supply module to dispose a surface of the indicator handle in view of a user beyond the operating position of any cables and other connection equipment operably coupled to connectors on the rear wall of the power supply chassis module to display the status condition to the user on the surface of the indicator handle that is disposed and visible beyond the operating position of any cables and other connection equipment operably coupled to connectors on the rear wall of the power supply chassis module.

11. An information handling system, comprising:
an information handling system chassis, the information handling system chassis comprising a power supply receptacle defined therein and configured to receive a power supply module;
a power supply module comprising a module chassis configured to be received in the power supply receptacle of the information handling system chassis, the power supply module chassis containing power conversion circuitry and having a rear wall with an outer surface; and
the power supply module further comprising:
at least one first light-emitting element coupled to emit light to display a status condition of the power conversion circuitry,
an indicator handle configured for use by a user to withdraw and insert the module chassis from the power supply receptacle, the indicator handle having a proximate end and a distal end disposed opposite to the proximate end, the indicator handle at least partially comprising light conductive material that is configured to transmit light from the proximate end toward the distal end of the handle, and
the indicator handle further comprising at least one light conductive handle leg having a leg base mechanically coupled at the proximate end of the handle to the outer surface of the power supply module chassis rear wall and extending outward from the power supply module chassis rear wall to the distal end of the handle, the light conductive material of the handle leg being disposed to receive the emitted light from the first light-emitting element and transmit the emitted light toward the distal end of the indicator handle to visibly display a status condition of the module circuitry to a user on a surface of the indicator handle that is spaced apart from the rear wall of the power supply module chassis;
wherein the at least one light conductive handle leg forms a separate segment of the indicator handle terminating at the distal end of the handle; and where the light conductive material of the handle leg is disposed to receive the emitted light from the first light-emitting element and transmit the emitted light toward the terminal distal end of the indicator handle to visibly display a status condition of the module circuitry to a user on the distal surface of the indicator handle that is spaced apart from the wall of the module chassis.

12. An information handling system, comprising:
an information handling system chassis, the information handling system chassis comprising a power supply receptacle defined therein and configured to receive a power supply module;
a power supply module comprising a module chassis configured to be received in the power supply receptacle of the information handling system chassis, the power supply module chassis containing power conversion circuitry and having a rear wall with an outer surface; and
the power supply module further comprising:
at least one first light-emitting element coupled to emit light to display a status condition of the power conversion circuitry,
an indicator handle configured for use by a user to withdraw and insert the module chassis from the power supply receptacle, the indicator handle having a proximate end and a distal end disposed opposite to the proximate end, the indicator handle at least partially comprising light conductive material that is configured to transmit light from the proximate end toward the distal end of the handle, and
the indicator handle further comprising at least one light conductive handle leg having a leg base mechanically coupled at the proximate end of the handle to the outer surface of the power supply module chassis rear wall and extending outward from the power supply module chassis rear wall to the distal end of the handle, the light conductive material of the handle leg being disposed to receive the emitted light from the first light-emitting element and transmit the emitted light toward the distal end of the indicator handle to visibly display a status condition of the module circuitry to a user on a surface of the indicator handle that is spaced apart from the rear wall of the power supply module chassis; and
the information handling system further comprising a status icon provided on the spaced apart surface of the indicator handle that is spaced apart from the rear wall of the power supply module chassis upon which the status condition of the module circuitry is displayed to a user.

13. The system of claim 11, the indicator handle comprising at least two light conductive handle legs that each have a respective leg base mechanically coupled at the proximate end of the handle to the outer surface of the power supply module chassis rear wall and extending outward from the power supply module chassis rear wall to the distal end of the handle, the light conductive material of each handle leg being disposed to receive the emitted light from a respective different first light-emitting element than the other of the handle legs and to transmit the emitted light toward the distal end of the indicator handle by a separate light path than the other of the handle legs to visibly display a status condition of the power supply module circuitry to a user on a surface of the indicator handle that is spaced apart from the rear wall of the power supply module chassis.

14. The system of claim 13, further comprising at least one surface indicating second light-emitting element mechanically coupled to the rear wall of the power supply module chassis and disposed in a position between the two light conductive handle legs, the surface indicating light emitting element being configured to emit light to display a different status condition of the power supply module circuitry than the status conditions displayed by the first light emitting elements.

15. The system of claim 11, the displayed status condition comprising at least one of power supply AC health, power supply DC health, power supply mismatch, or a combination thereof.

16. The system of claim 11, the power supply module being received in the power supply receptacle of the information handling system such that the indicator handle extends outward from the rear wall of the power supply module to dispose a surface of the indicator handle in view of a user beyond the operating position of any cables and other connection equipment operably coupled to connectors on the rear wall of the power supply chassis module to display the status condition to the user on the surface of the indicator handle that is disposed and visible beyond the operating position of any cables and other connection equipment operably coupled to connectors on the rear wall of the power supply chassis module.

17. The system of claim 11, the information handling system comprising a rack mounted server.

18. A method of displaying one or more status conditions of an equipment module to a user, the method comprising:
providing an equipment module comprising a module chassis containing module circuitry and having at least one wall with an outer surface;
providing an indicator handle configured for use by a user to withdraw and insert the module chassis from an equipment assembly, the indicator handle having a proximate end and a distal end disposed opposite to the proximate end, and
having at least one light conductive handle leg having a leg base mechanically coupled at the proximate end of the handle to the outer surface of the chassis wall and extending outward from the chassis wall to the distal end of the handle; emitting at least one first light adjacent the proximate end of the indicator handle to display a status condition of the module circuitry; transmitting the emitted first light from the proximate end of the indicator handle through the light conductive handle leg toward the distal end of the indicator handle to visibly display a status condition of the module circuitry to a user on a surface of the indicator handle that is spaced apart from the wall of the module chassis;
the at least one light conductive handle leg forming a separate segment of the indicator handle terminating at the distal end of the handle; and
the light conductive material of the handle leg receiving the emitted light from the first light-emitting element and transmitting the emitted light toward the terminal distal end of the indicator handle visibly displaying a status condition of the module circuitry to a user on the distal surface of the indicator handle that is spaced apart from the wall of the module chassis.

19. The method of claim 18, the provided indicator handle comprising multiple light conductive handle legs that each have a respective leg base mechanically coupled at the proximate end of the handle to the outer surface of the chassis wall and extending outward from the chassis wall to the distal end of the handle; and the method further comprising:
emitting multiple separate first lights adjacent the proximate end of the indicator handle to display multiple separate respective status conditions of the module circuitry; and
transmitting each of the multiple separate emitted first lights from the proximate end of the indicator handle through a respective separate one of the light conductive handle legs toward the distal end of the indicator handle to visibly display each of the status conditions of the module circuitry to a user on a separate respective surface of the indicator handle that is spaced apart from the wall of the module chassis.

20. The module of claim 19, further comprising emitting at least one second light adjacent the outer surface of the module chassis wall between at least two of the light conductive handle legs; the light indicating a different status condition of the module circuitry than the status conditions displayed by the emitted first lights; and transmitting substantially none of the second light through the light conductive handle legs.

21. The method of claim 18, the equipment module comprising a rack mounted power supply module and the module circuitry comprising hot-swappable power supply circuitry, with the at least one chassis wall with an outer surface being the rear wall of the power supply module; and the method further comprising:
providing the module chassis in a mechanically received position within a complementary dimensioned power supply receptacle of a rack mounted server; and
emitting the at least one first light to display status condition of the power supply module circuitry that comprises at least one of power supply AC health, power supply DC health, power supply mismatch, or a combination thereof.

22. The module of claim 4, where the indicator handle is a single piece of light-conductive material; where the two light conductive handle legs comprise a first light conductive handle leg that is joined to a second light conductive handle leg at the distal end of the handle by a cross member segment that defines a handle aperture between the first and second handle legs;
where the cross member is narrowed between the first and second handle legs by two sloped step-down surfaces, each given one of the two sloped step-down surfaces being disposed adjacent one of the corresponding first or second handle legs to define a narrowed portion of the cross member segment between the first and second handle legs; and where the two sloped step-down surfaces are configured to at least partially prevent light from bleeding between the light conductive material of the first light conductive handle leg to the light conductive material of the second conductive handle leg.

23. The module of claim 4, where the two light conductive handle legs respectively comprise two outer side pieces of light-conductive material that are joined to a center piece of non-light conductive material such that the respective light paths of each of the two light conductive handle legs are completely separated.

24. The module of claim 6, where the indicator handle is a single piece of light-conductive material; and where the module further comprises:
at least two first light emitting elements;
a carrier plate disposed between the equipment module chassis and the indicator handle, the carrier plated having a first aperture defined therein to receive light from a first one of the light-emitting elements, and a second element defined therein to receive light from a second and different one of the light-emitting elements; and where the carrier plate further comprises each of the light shields, the light shields being positioned adjacent an interior side of each of the two first light-emitting elements when the equipment module chassis and the indicator handle carrier plate are assembled together with the carrier plate positioned therebetween.

* * * * *